United States Patent
Ge et al.

(10) Patent No.: US 8,865,012 B2
(45) Date of Patent: Oct. 21, 2014

(54) METHODS FOR PROCESSING A SUBSTRATE USING A SELECTIVELY GROUNDED AND MOVABLE PROCESS KIT RING

(71) Applicant: Applied Materials, Inc., Santa Clara, CA (US)

(72) Inventors: Zhenbin Ge, San Jose, CA (US); Alan A. Ritchie, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/831,424

(22) Filed: Mar. 14, 2013

(65) Prior Publication Data

US 2014/0273483 A1    Sep. 18, 2014

(51) Int. Cl.
 *B44C 1/22* (2006.01)
 *C03C 15/00* (2006.01)
 *C03C 25/68* (2006.01)
 *C23F 1/00* (2006.01)
 *H01L 21/3065* (2006.01)

(52) U.S. Cl.
 CPC .................................. *H01L 21/3065* (2013.01)
 USPC ......................................................... 216/67

(58) Field of Classification Search
 USPC .................. 216/67; 156/345.51; 118/715; 204/298.11
 See application file for complete search history.

(56) References Cited

U.S. PATENT DOCUMENTS

| | | | |
|---|---|---|---|
| 2011/0186426 A1* | 8/2011 | Hawrylchak et al. | 204/298.11 |
| 2011/0272100 A1 | 11/2011 | Koshiishi | |
| 2012/0003836 A1 | 1/2012 | Kellogg et al. | |
| 2012/0103257 A1 | 5/2012 | Rasheed et al. | |
| 2012/0205241 A1 | 8/2012 | Young et al. | |
| 2013/0032478 A1 | 2/2013 | Lee et al. | |

OTHER PUBLICATIONS

U.S. Appl. No. 13/831,363, filed Mar. 14, 2013, Rasheed et al.
International Search Report and Written Opinion mailed Jun. 26, 2014 for PCT Application No. PCT/US2014/022593.

* cited by examiner

*Primary Examiner* — Roberts Culbert
(74) *Attorney, Agent, or Firm* — Moser Taboada; Alan Taboada

(57) ABSTRACT

Methods for processing a substrate are provided herein. In some embodiments, a method for processing a substrate may include placing a substrate atop a substrate support disposed beneath a processing volume of a process chamber having a grounded shield surrounding the process volume and a conductive cover ring selectably supportable by the grounded shield; positioning the substrate support in a first position such that the substrate support is not in contact with the conductive cover ring and such that a conductive member electrically coupled to the cover ring contacts the grounded shield to electrically couple the cover ring to the grounded shield; and performing a plasma enhanced etch process on the substrate.

20 Claims, 8 Drawing Sheets

METHODS FOR PROCESSING A SUBSTRATE USING A SELECTIVELY GROUNDED AND MOVABLE PROCESS KIT RING

FIELD

Embodiments of the present invention generally relate to a semiconductor substrate processing.

BACKGROUND

High frequency radio frequency (RF) plasma processes may produce a higher ionization ratio, as compared to other conventional plasma processes (e.g., such as a DC plasma process), thereby providing more flexibility and a wider range of process applications. However, the inventors have observed that, when performing etch processes utilizing a high frequency power source, an etching rate proximate an edge of a substrate may be higher (e.g., such as 2 to 3 times higher or greater) that that of an etching rate in other regions of the substrate, thereby leading to undesirable non-uniform etching results.

Therefore, the inventors have provided an improved method for processing susbstrates.

SUMMARY

Methods for processing a substrate are provided herein. In some embodiments, a method for processing a substrate may include placing a substrate atop a substrate support disposed beneath a processing volume of a process chamber having a grounded shield surrounding the process volume and a conductive cover ring selectably supportable by the grounded shield; positioning the substrate support in a first position such that the substrate support is not in contact with the conductive cover ring and such that a conductive member electrically coupled to the cover ring contacts the grounded shield to electrically couple the cover ring to the grounded shield; and performing a plasma enhanced etch process on the substrate.

In some embodiments, a computer readable medium having instructions stored thereon that, when executed, cause a method of processing a substrate to be performed in a process chamber, wherein the method may include: placing a substrate atop a substrate support disposed beneath a processing volume of a process chamber having a grounded shield surrounding the process volume and a conductive cover ring selectably supportable by the grounded shield; positioning the substrate support in a first position such that the substrate support is not in contact with the conductive cover ring and such that a first conductive member electrically coupled to the cover ring contacts the grounded shield to electrically couple the cover ring to the grounded shield; and performing a plasma enhanced etch process on the substrate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
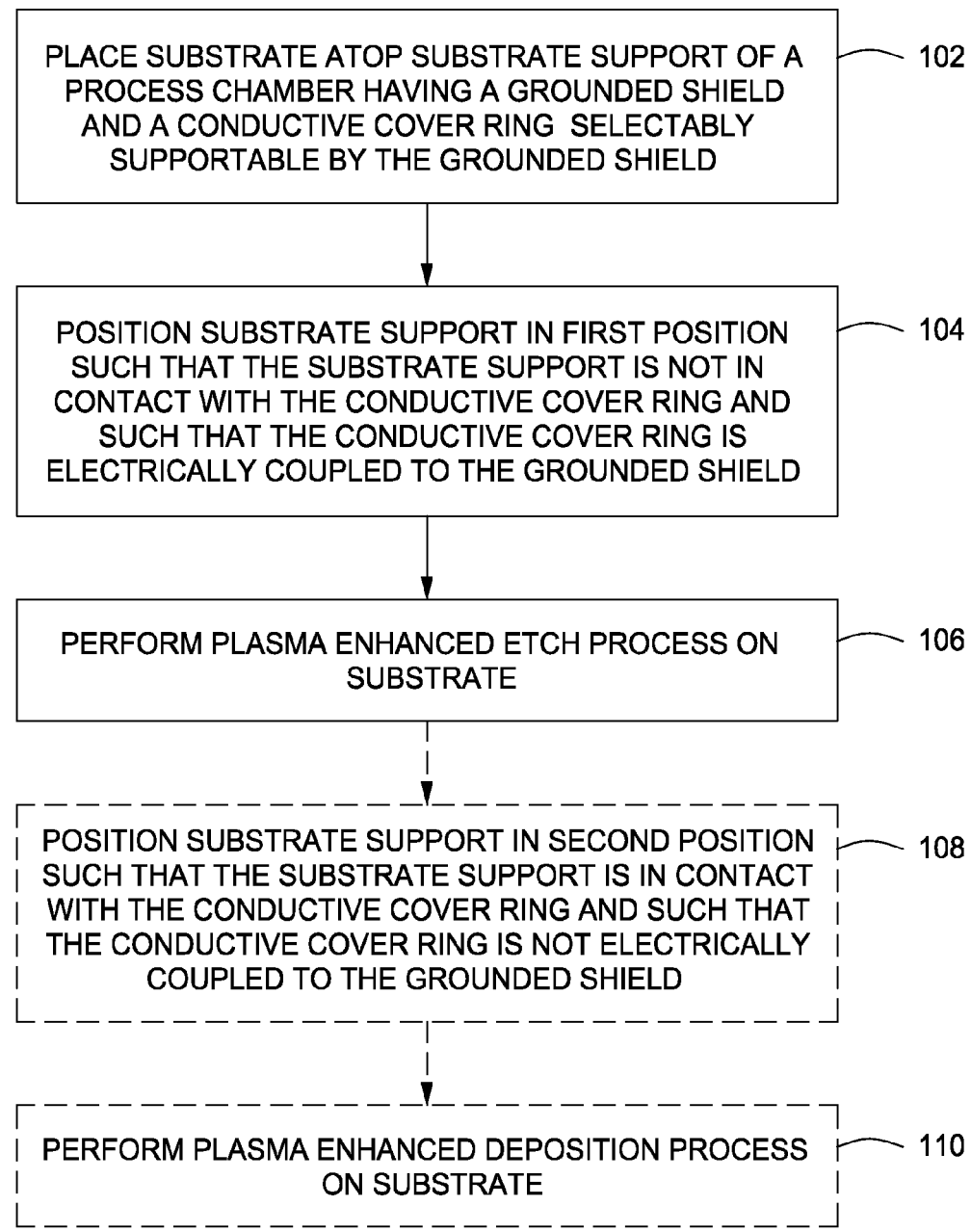
FIG. 1 is a method for processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods for processing a substrate are provided herein. In at least some embodiments, the inventive methods may advantageously facilitate a plasma enhanced etch process utilizing a high frequency power source that produces more uniform etching across the substrate. For example, the inventive methods may advantageously modulate a local electrical flux produced during the etch process and redistribute an ion flux of the plasma, thereby providing a reduction or elimination of etching non-uniformity typically observed in conventional high frequency plasma enhanced etch processes. In addition, the inventive methods may advantageously facilitate a deposition process that provides an increased coverage of deposited material at a bottom of a substrate feature. For example, the inventive methods may advantageously provide an electrically floating cover ring that maintains a maximum electrical potential with respect to an electrical potential of a plasma, thereby providing the increased coverage.

Figure 2:
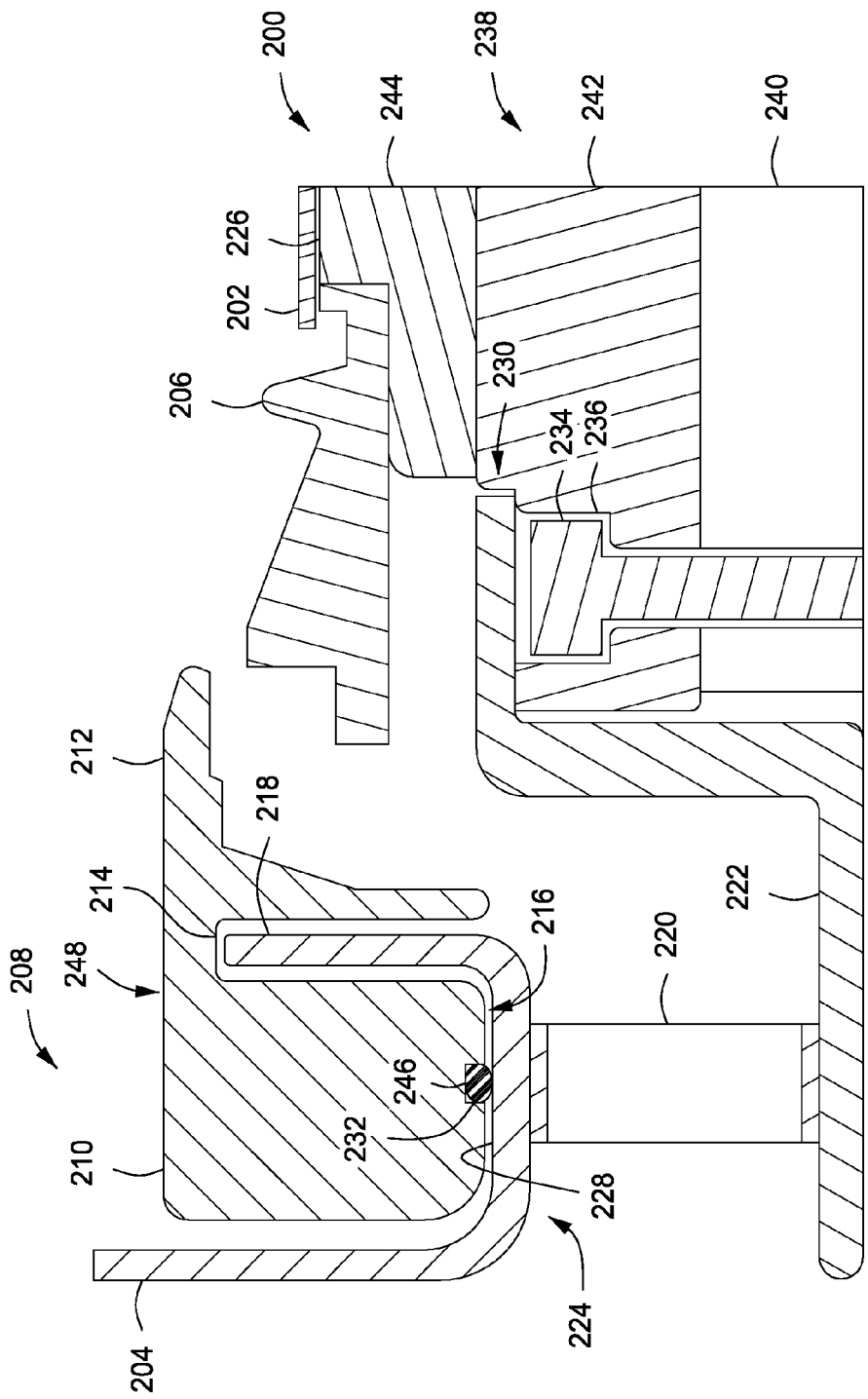
FIG. 2 depicts a side view of a portion of a process chamber during a method for processing a substrate in accordance with some embodiments of the present invention.
Figure 3:
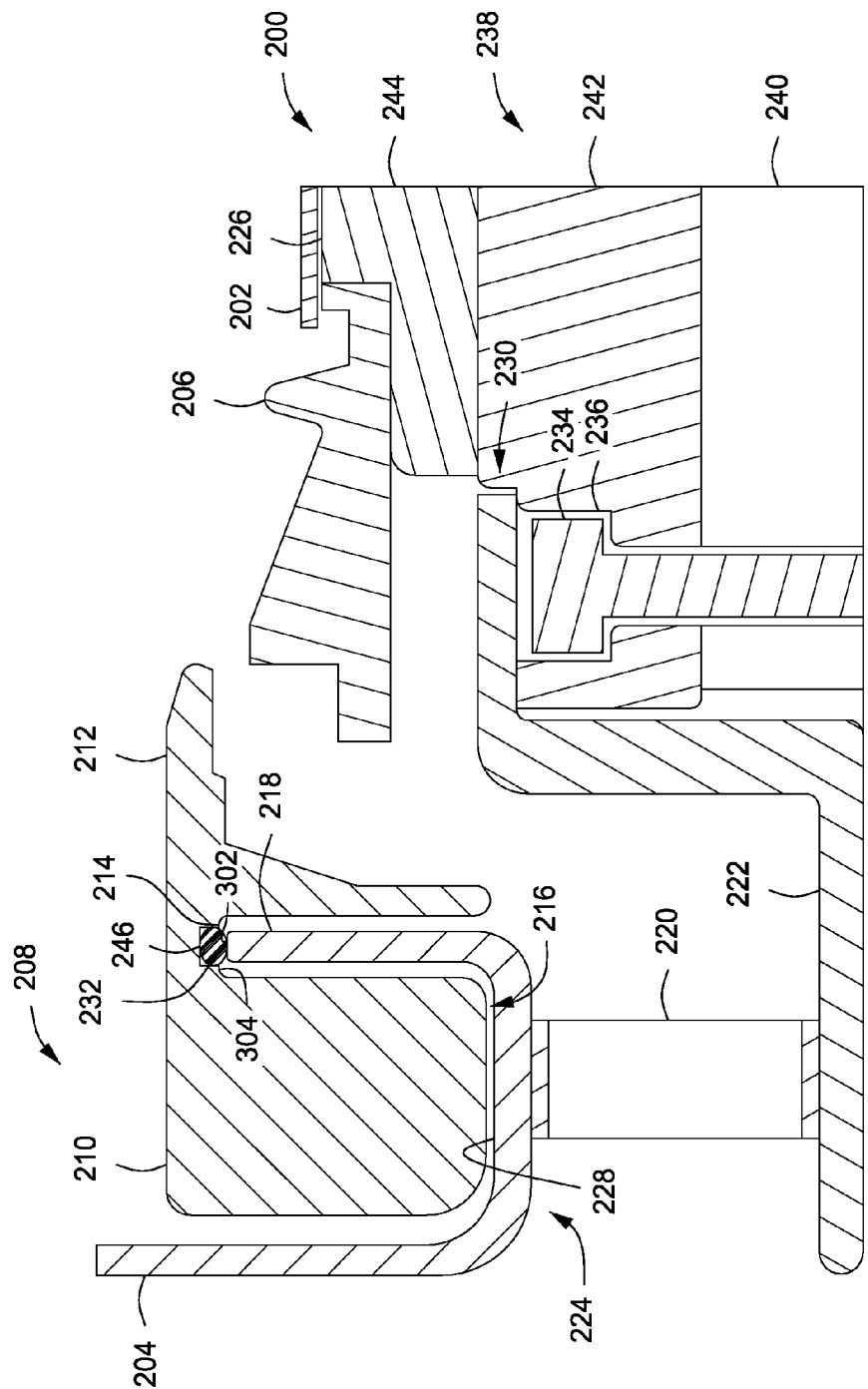
FIG. 3 depicts a side view of a portion of a process chamber during a method for processing a substrate in accordance with some embodiments of the present invention.

Referring to FIG. 1, the method 100 generally begins at 102 where a substrate 202 is placed atop a substrate support 200 of a process chamber, such as shown in FIG. 2. The substrate 202 may be any type of substrate suitable for the fabrication of a semiconductor device. For example, the substrate 202 may be a doped or un-doped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 202 may be a semiconductor wafer, such as a 200, 300, or 450 mm semiconductor wafer, or the like. In some embodiments, the substrate 202 may comprise one or more layers (not shown), for example, such as dielectric layers, oxide layers, nitride layers, or the like. In addition, in some embodiments the substrate 202 may comprise one or more features formed in the substrate 202, for example, such as a trench, via, dual damascene structure, or the like. In some embodiments, the one or more features may be high aspect ratio features having, for example, a height to width aspect ratio of at least about 4:1.

The process chamber may be any process chamber suitable for semiconductor device fabrication and modified in accordance with the teachings provided herein, for example, such as the physical vapor deposition (PVD) process chamber described below with respect to FIG. 8. Referring to FIG. 2, in some embodiments, the process chamber may generally include the substrate support 200, a grounded shield 204 and a cover ring 208 selectably supportable by the grounded shield 204.

The substrate support 200 may be any type of substrate support 200 suitable for semiconductor substrate fabrication, for example, such as the substrate supports shown in FIG. 2 and/or described below with respect to FIG. 8. In some embodiments, the substrate support 200 may generally include a body 238 having a substrate supporting surface 226, a deposition ring 206 and a housing 222 disposed about at least a portion of the body 238.

In some embodiments, the body 238 may comprise one or more layers (three layers 240, 242, 244 shown) disposed atop one another, forming the body 238. For example, in some embodiments, the substrate support 200 may comprise a first layer 244 fabricated from a dielectric material and having an electrode embedded therein to provide chucking power to facilitate securing the substrate 202 on the substrate support surface 226 (e.g., an electrostatic chuck). The dielectric material may be any process compatible dielectric material, for example, a ceramic such as aluminum oxide ($Al_2O_3$), silicon nitride (SiN), or the like. Additional layers (e.g., the second layer 242 and third layer 240) may include one or more conductive layers disposed below the first layer 244 configured to, for example, be part of an RF electrode, or the like which may be used to provide RF energy to the substrate support 200. In some embodiments, the one or more layers may be coupled together via, for example, a fastener 234 (e.g., a bolt, screw, rivet, or the like). In such embodiments, the body 238 may comprise a hole 236 configured to receive the fastener 234.

In some embodiments, the body 238 may be at least partially surrounded by the housing 222. When present, the housing 222 may protect one or more components of the body 238 from damage and/or contamination during processing. In some embodiments, a portion of the housing 222 may rest within a notch 230 formed in the body 238, such as shown in FIG. 2. The housing 222 may be fabricated from any process compatible conductive material, for example a metal such as aluminum, an aluminum alloy, stainless steel, or the like.

When present, the deposition ring 206 is disposed about the periphery of the substrate support surface 226 and at least partially beneath the substrate 202 when the substrate is disposed atop the substrate support 200. The deposition ring 206 protects the body 238 from damage and/or contamination from processing.

The grounded shield 204 surrounds the cover ring 208 and extends upwards along walls of the process chamber (e.g., as described below with respect to FIG. 8). In some embodiments, the grounded shield 204 includes an inwardly extending ledge 224 that terminates at the end 218 of the grounded shield 204. In some embodiments, the grounded shield 204 may be grounded via an electrical coupling of the grounded shield 204 to a grounded component of the process chamber (e.g., process chamber walls, enclosure, or the like). In some embodiments, the grounded shield 204 may be electrically coupled to the housing 222. In such embodiments, a grounding member 220 (or a plurality of grounding members 220) may couple the shield 204 to the housing 222 to ensure a robust electrical coupling. The grounding member 220 may be fabricated from any process compatible conductive material, for example such as aluminum. In some embodiments, the grounding member 220 may be a loop of conductive material forming a spring. In some embodiments, the conductive material may be flexible to facilitate continuous coupling of the shield 204 to the housing 222 during movement of the substrate support 200 and/or to facilitate a more robust and uniform ground connection azimuthally about the perimeter of the substrate support. In some embodiments, one or more fasteners (not shown) may facilitate coupling the shield 204 to the housing 222.

The cover ring 208 is generally disposed about the substrate support 200. When present, the cover ring 208 protects other chamber components (e.g., portions of the substrate support 200, the shield 204, or the like) from damage and/or contamination from processing. The cover ring 208 may be fabricated from any process compatible conductive material, for example, a metal such as aluminum, an aluminum alloy, titanium, a titanium alloy, stainless steel, or the like.

The cover ring 208 generally includes a body 210 having a lip 212 that extends inwardly to an area proximate a peripheral edge of the substrate support 200. In some embodiments, the cover ring 208 may comprise one or more features to facilitate maintaining the cover ring 208 in a desired position during processing. For example, in some embodiments, the cover ring 208 may comprise a first channel 214 formed in a bottom 216 of the cover ring 208 and configured to interface with the end 218 of the grounded shield 204. In such embodiments, the cover ring 208 may be at least partially supported and held in place by the grounded shield 204.

When disposed atop the grounded shield 204, such as shown in FIG. 2, portions of the cover ring 208 may rest on portions of the grounded shield 204. Such contact between the cover ring 208 and the grounded shield 204 may, in certain processes, provide a sufficient electrical coupling of the cover ring 208 and the grounded shield 204, thereby grounding the cover ring 208. Any portion of the cover ring 208 may contact the grounded shield 204 to provide the electrical coupling as described above. For example, in some embodiments, the bottom 216 of the body 210 may contact an inner bottom surface 228 of the inwardly extending ledge 224.

However, the inventors have observed that in certain high frequency plasma processes, such direct physical contact between the grounded shield 204 and the cover ring 208 are insufficient to provide an electrically conductive path between the components, such that the cover ring 208 is essentially electrically floating with respect to the plasma. Accordingly, in some embodiments, a first conductive member 246 may be disposed between the cover ring 208 and the grounded shield 204 to facilitate the electrical coupling of the cover ring 208 and the grounded shield 204, thereby grounding the cover ring 208. The inventors have observed that providing the first conductive member 246 provides a more robust electrical coupling between the cover ring 208 and the grounded shield 204 as compared to, for example, just contacting portions of the cover ring 208 to the grounded shield 204. In addition, the inventors have observed that the first conductive member 246 may provide an electrical coupling during processes utilizing a high frequency power source (e.g., greater than about 27 MHz) that would otherwise not be obtainable by contacting portions of the cover ring 208 and the grounded shield 204.

The first conductive member 246 may comprise any size or shape suitable to provide the above described electrical coupling of the cover ring 208 and the grounded shield 204. For example, in some embodiments, the first conductive member 246 may be a gasket, a tubular or solid ring, or in some embodiments, a canted coil spring. The first conductive member 246 may be fabricated from any process compatible conductive materials, for example, a metal such as aluminum, an aluminum alloy, stainless steel, or the like.

In some embodiments, the first conductive member 246 may be at least partially disposed within a second channel 232 formed in the bottom 216 of the body 144. The second channel 232 may be disposed in any position with respect to the body 210, for example, such as disposed radially outward of the first channel 214. In such embodiments, the first conductive member 246 contacts the inwardly extending ledge 224 of the conductive shield 204.

In some embodiments, the lip 212 may be configured to at least partially overlap with a portion of the deposition ring 206. Configuring the lip 212 to at least partially overlap the portion of the deposition ring 206 allows the lip 212 to interface with the deposition ring 212 as the deposition ring 206 is raised. In operation, as the deposition ring 206 is raised (via raising the substrate support 200), the deposition ring 206 interfaces with the lip 212 and lifts the cover ring 208 off of the grounded shield 204. By lifting the cover ring 208, contact between the cover ring 208 and the grounded shield 204 is broken, thereby eliminating the electrical coupling between the conductive shield 204 and the cover ring 208, thus causing the cover ring 208 to be electrically floating. As such, the cover ring 208 may be selectively grounded and/or supported in accordance with a desired process performed in the process chamber by lifting the cover ring 208 and eliminating coupling between the cover ring 208 and the grounded shield 204 or lowering the ring to electrically couple the cover ring 208 and the grounded shield 204 (as shown in FIG. 2).

Although the first conductive member 246 is depicted in FIG. 2 as electrically coupling the cover ring 208 to the grounded shield 204 proximate the inner bottom surface 228 of the inwardly extending ledge 224, the first conductive member 246 may be positioned in any manner suitable to provide an adequate electrical coupling of the grounded shield 204 and the cover ring 208 to ground the cover ring 208. For example, in some embodiments, the first conductive member 246 may be disposed on an upper surface 304 of the first channel 214 such that the first conductive member 246 contacts an outer edge 302 of the end 218 of the grounded shield 204. In such embodiments, the first conductive member 246 may be at least partially disposed in the second channel 232 as described above.

Figure 4:
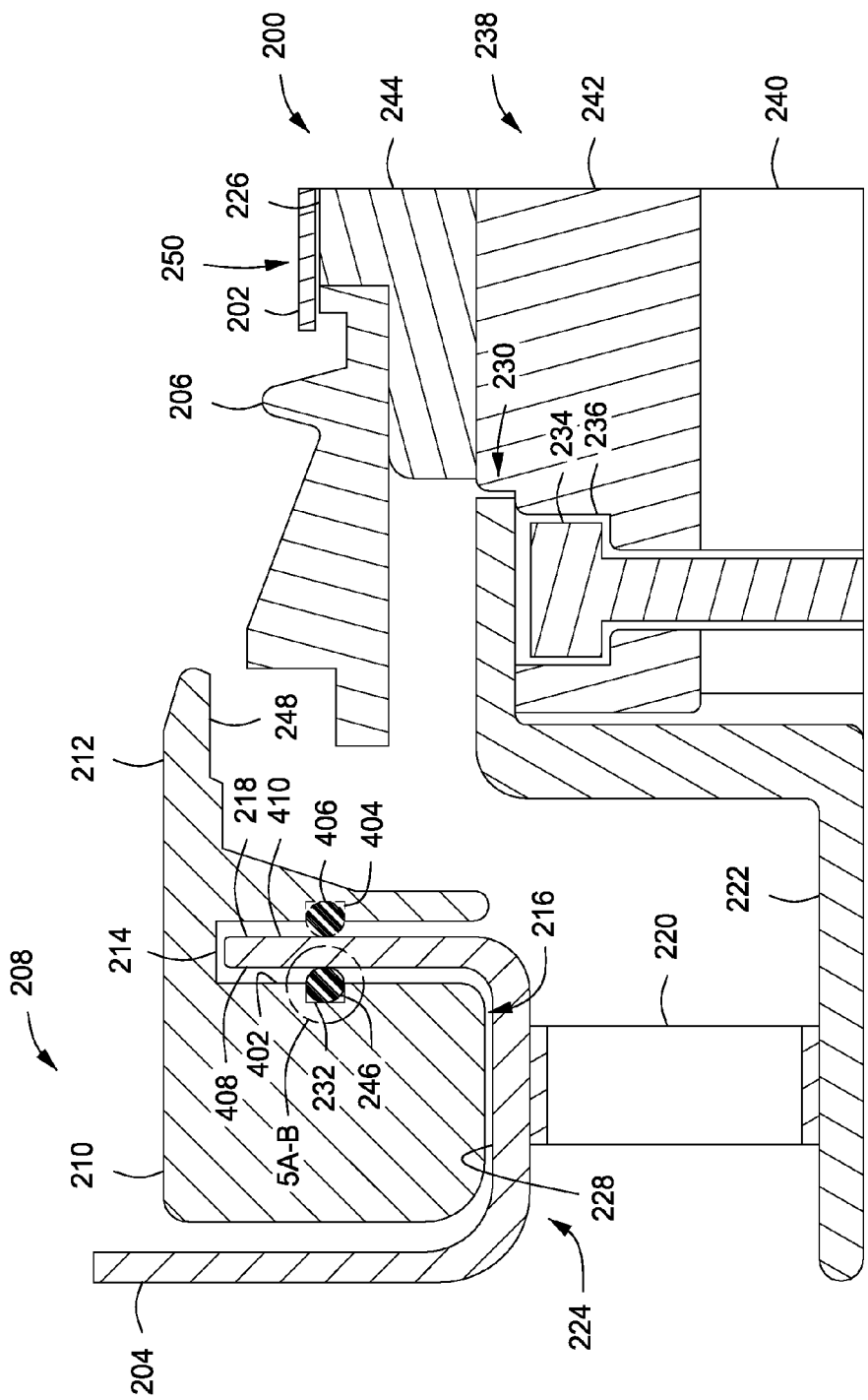
FIG. 4 depicts a side view of a portion of a process chamber during a method for processing a substrate in accordance with some embodiments of the present invention.

Alternatively, or in combination, in some embodiments, the first conductive member 246 may be disposed on an inner surface 402 of the first channel 214 such that the first conductive member 246 contacts the grounded shield 204 at an inner surface 408 of the end 218 of the inwardly extending ledge 224, such as shown in FIG. 4. Alternatively, or in combination, in some embodiments, the first conductive member 246 may be disposed on an inner surface 402 of the first channel 214 such that the first conductive member 246 contacts the grounded shield 204 at an outer surface 410 of the end 218 of the inwardly extending ledge 224 (second channel 404 and conductive member 406 shown in phantom).

The inventors have observed that by providing contact between the first conductive member 246 and the inner surface 408 and/or the outer surface 410 of the end 218 of the inwardly extending ledge 224, the contact (and thus the electrical coupling) between the cover ring 208 and the grounded shield 204 will be maintained during movement of the cover ring 208 until the first conductive member 246 is moved beyond the end 218 of the grounded shield 204. Thus, the height of the cover ring 208 may be adjusted while the cover ring 208 remains grounded, thereby providing more flexibility in processing.

Figure 5A:
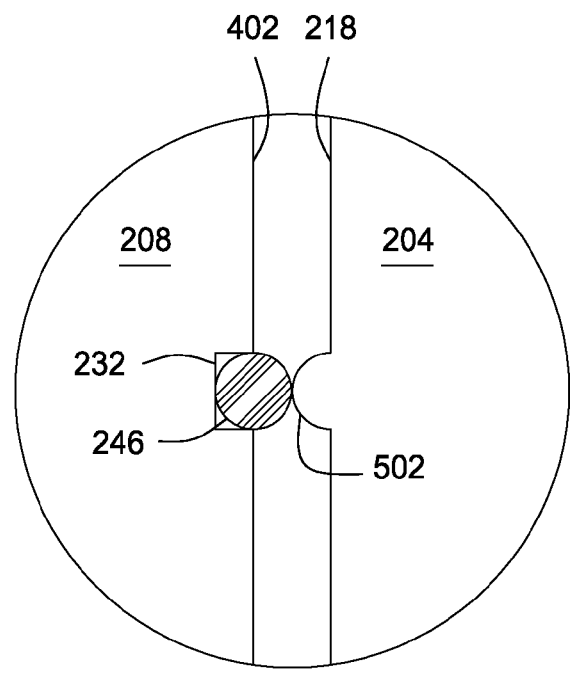
FIGS. 5A-B depict a side view of a portion of a process chamber during a method for processing a substrate in accordance with some embodiments of the present invention.
Figure 5B:
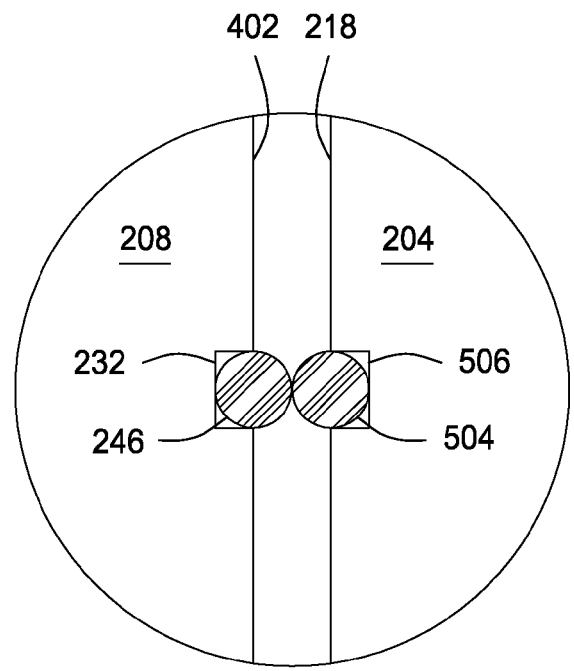

In some embodiments, the grounded shield 204 may comprise one or more features configured to interface with the first conductive member 246 to facilitate the electrical coupling of the cover ring 208 and the grounded shield 204 as described above. For example, in some embodiments, the grounded shield 204 may comprise a protrusion 502 extending from the end 218 of the grounded shield 204 and configured to interface with the first conductive member 246 such as shown in FIG. 5A. Alternatively, or in combination, in some embodiments, the grounded shield 204 may comprise a second conductive member 504 configured to interface with the first conductive member 246, such as shown in FIG. 5B. The second conductive member 504 may be partially disposed within a third channel 506. In such embodiments, the first conductive member 246 maybe of any type, shape, size and fabricated from any suitable materials, for example such as the type, shape, size and materials discussed above with respect to the first conductive member 246.

Referring back to FIG. 1, next at 104, the substrate support 200 is positioned in a first position such that the substrate support 200 is not in contact with the cover ring 208 and such that the cover ring 208 is electrically coupled to the grounded shield 204, such as shown in FIG. 2. By positioning the substrate support 200 in the first position, the cover ring 208 is grounded, thus providing a grounded plane (a plane parallel to a top surface of the cover ring 208) disposed above the substrate 202.

The inventors have observed that by providing the grounded plane above the substrate 202, an etching non-uniformity proximate an edge of the substrate 202 typically produced during conventional plasma enhanced etch processes may be reduced or eliminated. In some embodiments, by providing the grounding plane above the substrate 202 the inventors have observed an etch uniformity of less than about 5%, as compared to about an etch uniformity of about 30% that may be obtained utilizing conventional etch processes. The inventors believe that providing the grounded plane above the substrate 202 may modulate a local electrical flux produced during the etch process and redistribute an ion flux of the plasma, thereby providing the aforementioned reduction or elimination of the etching non-uniformity.

When positioned in the first position, the substrate support 200 may support the substrate 202 any distance below the cover ring 208 sufficient to reduce or eliminate the etching non-uniformities as described above. For example, in some embodiments, a distance between a bottom surface 248 of the lip 212 and a top surface 250 of the substrate 202 may be about 5 mm to about 20 mm.

Figure 7A:
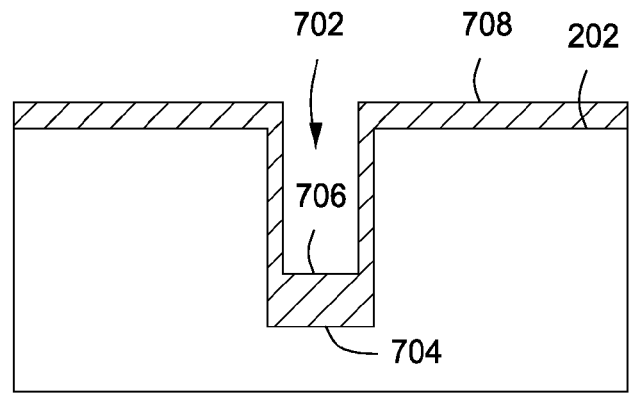
FIGS. 7A-C depict side views of a portion of a substrate during various stages of a method for processing a substrate in accordance with some embodiments of the present invention.
Figure 7B:
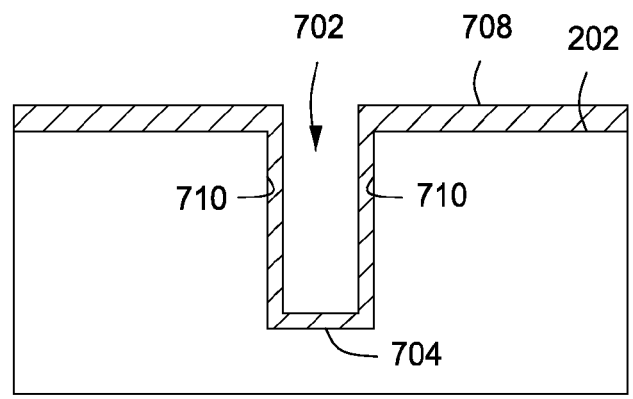

Next, at 106, a plasma enhanced etch process is performed on the substrate 202. The plasma enhanced etch process may be any type of plasma enhanced etch process suitable for semiconductor device fabrication. For example, in some embodiments, the plasma enhanced etch process may utilize a RF frequency power source ranging from about 2 MHz to about 13 MHz to ignite a process gas and as well as biasing the substrate to form a plasma to etch and/or redistribute material disposed atop a substrate. In some embodiments, the plasma enhanced etch process may utilize dual frequency power sources, such as utilizing high frequency (e.g., greater than about 27 MHz, such as about 27 MHz to about 162 MHz, or about 40 MHz) to ignite a process gas to form a plasma and simultaneously utilizing another frequency (e.g. from 2 MHz to 40 MHz) to lower the potential of the substrate so that the ions from the plasma can be accelerated to etch and/or redistribute material disposed atop a substrate. For example, referring to FIG. 7A, in some embodiments, the deposition of a layer 708 of material atop the substrate 202 may result in the deposition of an excess of material 706 on a bottom surface 704 of a feature 702 formed in the substrate 202. By performing the above described etch process, the material 706 may be etched and redistributed on the sidewalls 710 of the feature 702, such as shown in FIG. 7B.

Figure 6:
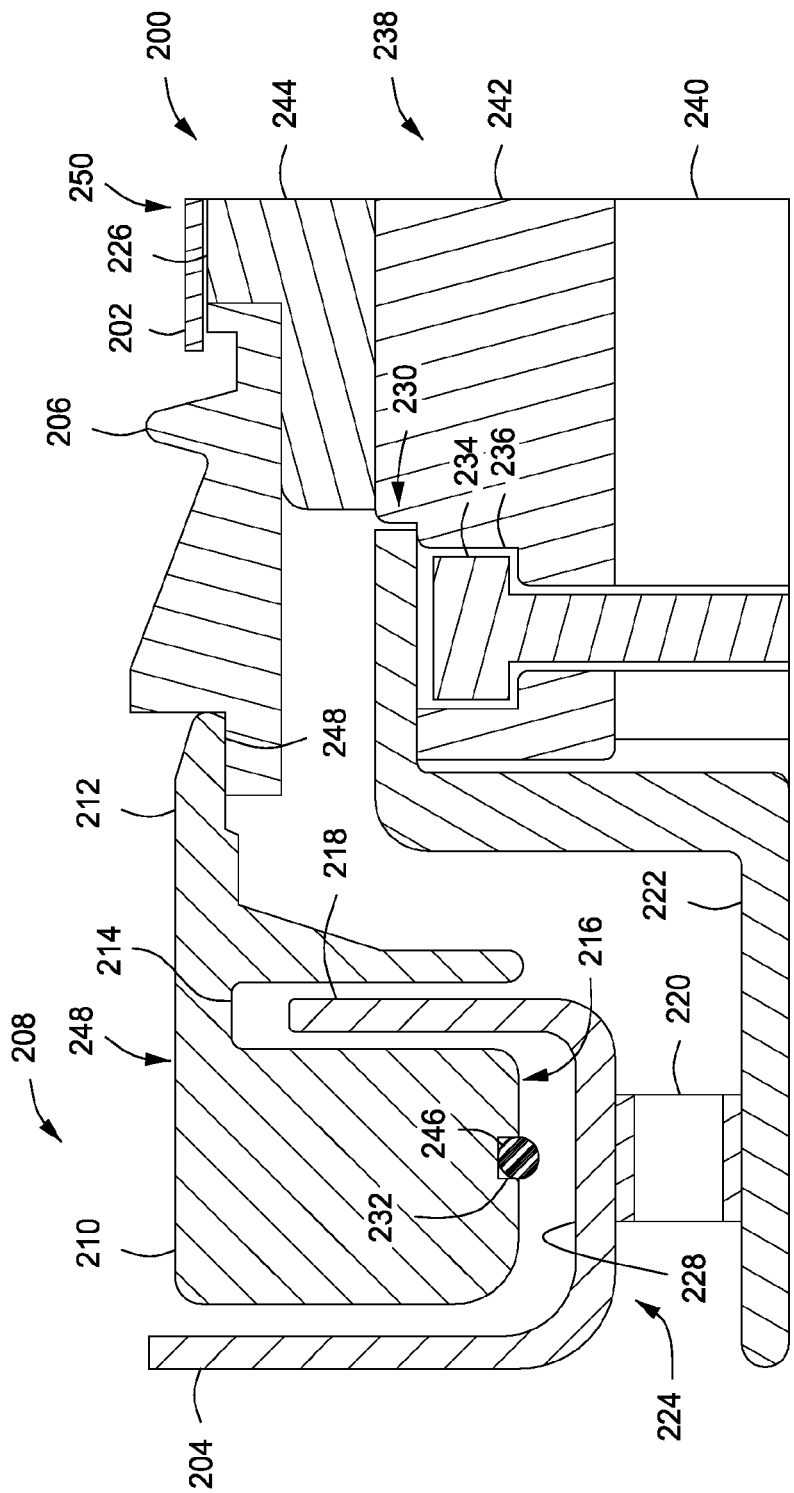
FIG. 6 depicts a side view of a portion of a process chamber during various stages of a method for processing a substrate in accordance with some embodiments of the present invention.

Next, at 108, the substrate support 200 is positioned in a second position such that the substrate support 200 is in contact with the cover ring 208 and such that the cover ring 208 is not electrically coupled to the grounded shield 204, such as shown in FIG. 6. When positioned in the second position, the lack of electrical coupling between the grounded shield 204 and the cover ring 208 causes the cover ring 208 to be electrically floating, and thus, not grounded.

Figure 7C:
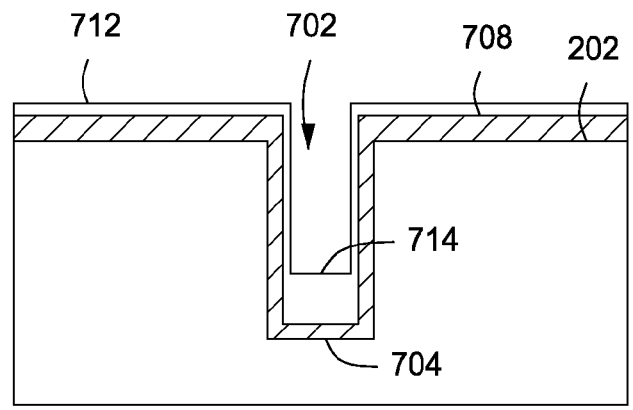

Next, at 110, a plasma enhanced deposition process is performed on the substrate. The deposition process may, for example, deposit a layer 712 atop at least portions of the substrate 202, for example such as shown in FIG. 7C. The inventors have observed that by performing the plasma enhanced deposition process while the substrate support 200 is disposed in the second position, a higher coverage of material 714 on a bottom 704 of the feature 702 may be obtained, as compared to conventional deposition processes. The inventors believe that by providing the substrate support 200 in the second position, and thereby maintaining the cover ring 208 in an electrically floating state, a maximum electrical potential of the cover ring 208 with respect to the electrical potential of the plasma may be obtained during the deposition process, thereby leading to the higher coverage of material 714 on a bottom 704 of the feature 702.

The deposition process may be any type of deposition process suitable to deposit materials for semiconductor device fabrication. For example, the deposition process may be a physical vapor deposition (PVD) process, a plasma enhanced chemical vapor deposition process (PECVD), or the like. The layer 712 may comprise any material suitable for semiconductor device fabrication, for example, a dielectric layer, a barrier layer, a conductive layer, a work function layer, or the like.

After the plasma enhanced deposition process is performed at 110, the method generally ends and the substrate may proceed for further processing to complete a desired semiconductor device. For example, in some embodiments, the substrate support may be moved to another position (e.g., returning back to the first position shown in FIG. 2) and an additional etch process may be performed to etch the layer deposited during the deposition process. Other processes may be performed, such as annealing, plasma treating, or the like.

Figure 8:
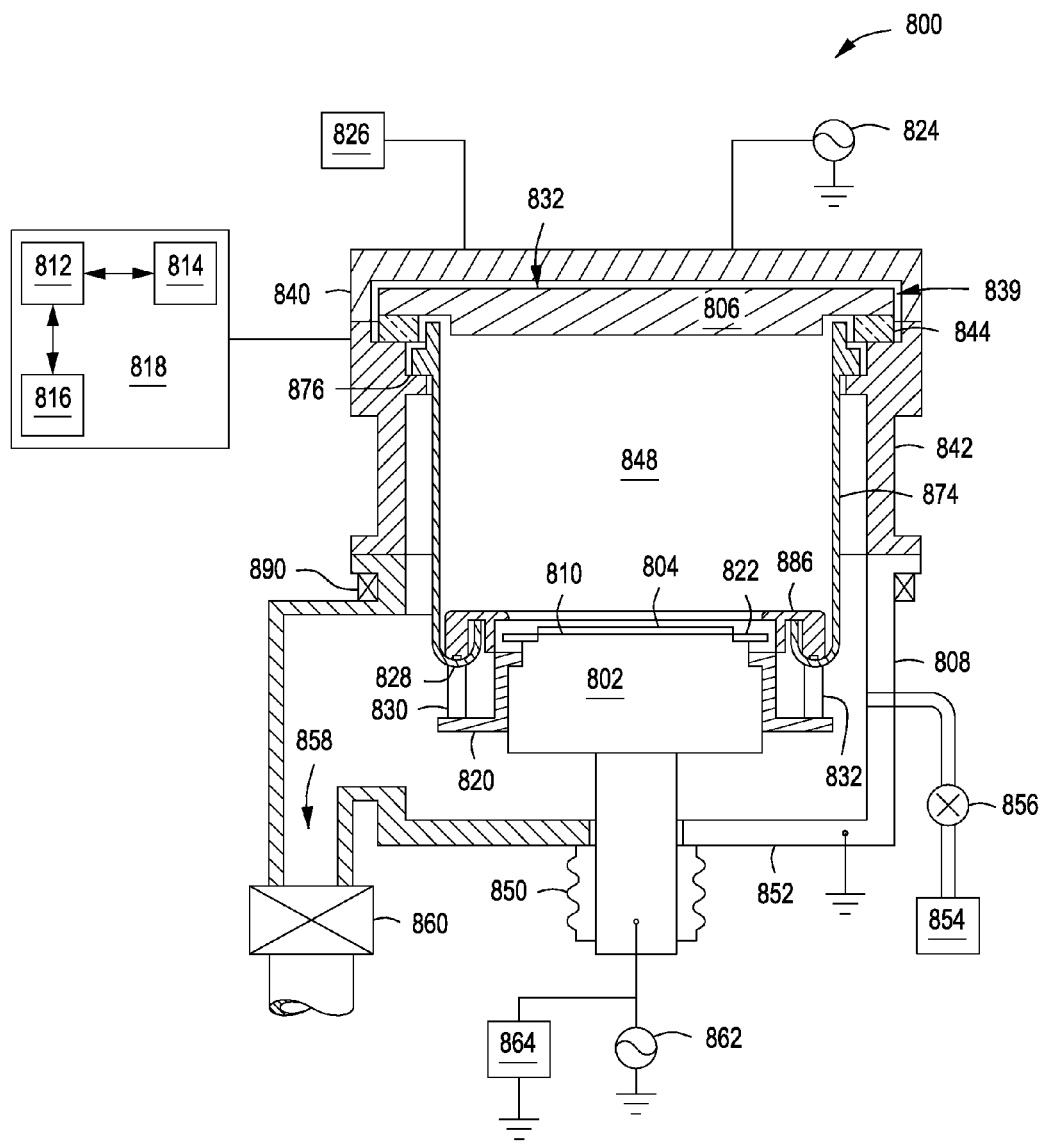
FIG. 8 depicts a schematic side view of a process chamber suitable for performing a method for processing a substrate in accordance with some embodiments of the present invention.

FIG. 8 depicts a schematic view of a process chamber suitable for use with the process kit described above in accordance with some embodiments of the present invention. Examples of suitable PVD chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive method disclosed herein.

The process chamber 800 contains a substrate support pedestal 802 (e.g., the substrate support pedestal 200 described above) for receiving a substrate 804 (e.g., the substrate 202 described above) thereon, and a sputtering source, such as a target 806. The substrate support pedestal 802 may be located within a grounded enclosure wall 808, which may be a chamber wall (as shown) or a grounded shield (a ground shield 840 is shown covering at least some portions of the process chamber 800 above the target 806). In some embodiments, the ground shield 840 could be extended below the target to enclose the pedestal 802 as well.

The target 806 may be coupled to a source distribution plate (not shown). The source distribution plate may be fabricated from suitable conductive materials to conduct power from one or more power sources to the target 806. Any number of power sources may be utilized to provide power to the target 806 to accommodate for a particular application or process performed in the process chamber 800. For example, in some embodiments, a DC power source 826 and RF power source 824 may provide DC power and RF power, respectively, to the target 806 via the source distribution plate. In such embodiments, the DC power source 826 may be utilized to apply a negative voltage, or bias, to the target 806. In some embodiments, RF energy supplied by the RF power source 824 may range in frequency from about 2 MHz to about 162 MHz, or, for example, non-limiting frequencies such as 2 MHz, 13.56 MHz, 27.12 MHz, 40 MHz, or 60 MHz can be used. In some embodiments, a plurality of RF power sources may be provided (e.g., two or more) to provide RF energy in a plurality of the above frequencies.

The ground shield 840 may be provided to cover the outside surfaces of the lid of the process chamber 800. The ground shield 840 may be coupled to ground, for example, via the ground connection of the chamber body. The ground shield 840 may comprise any suitable conductive material, such as aluminum, copper, or the like. An insulative gap 839 is provided between the ground shield 840 and the outer surfaces of the distribution plate, and the target 806 to prevent the RF and DC energy from being routed directly to ground. The insulative gap may be filled with air or some other suitable dielectric material, such as a ceramic, a plastic, or the like.

The target 806 may be supported on a grounded conductive aluminum adapter 842 through a dielectric isolator 844. The target 806 comprises a material to be deposited on the substrate 804 during sputtering, such a metal or metal oxide. In some embodiments, a backing plate (not shown) may be coupled to the source distribution plate-facing surface of the target 806. The backing plate may comprise a conductive material, such as copper-zinc, copper-chrome, or the same material as the target, such that RF and DC power can be coupled to the target 806 via the backing plate. Alternatively, the backing plate may be non-conductive and may include conductive elements (not shown) such as electrical feedthroughs or the like for coupling RF and DC power to the target 806.

The substrate support pedestal 802 has a substrate support surface 810 facing the principal surface of the target 806 and supports the substrate 804 to be processed. In some embodiments, a housing 820 (e.g., the housing 222 described above) may be disposed about at least a portion of the substrate support pedestal 802. The substrate support pedestal 802 may support the substrate 804 in a processing volume 848 of the process chamber 800. The processing volume 848 is defined as the region above the substrate support pedestal 802 during processing (for example, between the target 806 and the substrate support pedestal 802 when in a processing position).

In some embodiments, the substrate support pedestal 802 may be vertically movable through a bellows 850 connected to a bottom chamber wall 852 to allow the substrate 804 to be transferred onto the substrate support pedestal 802 through a load lock valve (not shown) in the lower portion of processing the process chamber 800 and thereafter raised to one or more positions for processing (e.g., as described above).

One or more processing gases may be supplied from a gas source 854 through a mass flow controller 856 into the lower part of the process chamber 800. An exhaust port 858 may be provided and coupled to a pump (not shown) via a valve 860 for exhausting the interior of the process chamber 800 and facilitating maintaining a desired pressure inside the process chamber 800.

In some embodiments, one or more power sources (an RF power source 862 and DC power source 864 shown) may be coupled to the substrate support 802. When present, the RF bias power source 862 may be coupled to the substrate support pedestal 802 to induce a negative DC bias on the substrate 804. In addition, in some embodiments, a negative DC self-bias may form on the substrate 804 during processing.

In some embodiments, the process chamber 800 may further include a shield 874 (e.g., the grounded shield 204 described above) connected to a ledge 876 of the adapter 842. The adapter 842 in turn is sealed and grounded to the aluminum chamber sidewall 808. Generally, the shield 874 extends downwardly along the walls of the adapter 842 and the chamber wall 808 downwardly to below an upper surface of the substrate support pedestal 802 and returns upwardly until reaching an upper surface of the substrate support pedestal 802, forming an inwardly extending ledge 828 (e.g., the inwardly extending ledge 224 described above). In some embodiments, one or more grounding members 830, 832 (e.g., the grounding member 220 described above) may electrically couple the shield 874 to the housing 820. In some embodiments, a ring 886 (e.g., the ring 208 described above) rests on the top of the inwardly extending ledge 828 of the shield 874. An additional deposition ring 822 (e.g., the deposition ring 206 described above) may be used to shield the periphery of the substrate 804 during processing.

In some embodiments, a magnet 890 may be disposed about the process chamber 800 for selectively providing a magnetic field between the substrate support pedestal 802 and the target 806. For example, as shown in FIG. 8, the magnet 890 may be disposed about the outside of the chamber wall 808 in a region just above the substrate support pedestal 802. In some embodiments, the magnet 890 may be disposed additionally or alternatively in other locations, such as adjacent the adapter 842. The magnet 890 may be an electromagnet and may be coupled to a power source (not shown) for controlling the magnitude of the magnetic field generated by the electromagnet.

A controller 818 may be provided and coupled to various components of the process chamber 800 to control the operation thereof. The controller 818 includes a central processing unit (CPU) 812, a memory 814, and support circuits 816. The controller 818 may control the process chamber 800 directly, or via computers (or controllers) associated with particular process chamber and/or support system components. The controller 818 may be one of any form of general-purpose computer processor that can be used in an industrial setting for controlling various chambers and sub-processors. The memory, or computer readable medium, 814 of the controller 818 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 816 are coupled to the CPU 812 for supporting the processor in a conventional manner. These circuits include cache, power supplies, clock circuits, input/output circuitry and subsystems, and the like. Inventive methods as described herein may be stored in the memory 814 as software routine that may be executed or invoked to control the operation of the process chamber 800 in the manner described herein. The software routine may also be stored and/or executed by a second CPU (not shown) that is remotely located from the hardware being controlled by the CPU 812.

Thus, embodiments of methods for processing a substrate have been provided herein. In at least some embodiments, the inventive methods may advantageously facilitate a plasma enhanced etch process utilizing a high frequency power source that produces uniform etching across the substrate.

While the foregoing is directed to embodiments of the present invention, other and further embodiments of the invention may be devised without departing from the basic scope thereof.

The invention claimed is:

1. A method for processing a substrate, comprising:
   placing a substrate atop a substrate support disposed beneath a processing volume of a process chamber having a grounded shield surrounding the process volume and a conductive cover ring selectably supportable by the grounded shield;
   positioning the substrate support in a first position such that the substrate support is not in contact with the conductive cover ring and such that a first conductive member electrically coupled to the cover ring contacts the grounded shield to electrically couple the cover ring to the grounded shield; and
   performing a plasma enhanced etch process on the substrate.

2. The method of claim 1, wherein the cover ring rests on the grounded shield when the substrate support is in the first position.

3. The method of claim 1, wherein performing the plasma enhanced etch process on the substrate comprises:
   providing a power at a frequency of greater than about 27 MHz from an RF power source to ignite a process gas to form a plasma; and
   etching a layer disposed atop the substrate.

4. The method of claim 3, wherein etching the layer disposed atop the substrate comprises:
   redistributing at least a portion of the layer from a bottom of feature formed in the substrate to a sidewall of the feature formed in the substrate.

5. The method of claim 1, wherein a distance from a top surface of the substrate to a bottom surface of the cover ring is about 5 mm to about 20 mm while in the first position.

6. The method of claim 1, wherein the first conductive member is one of a gasket, tubular or solid ring, or a canted coil spring.

7. The method of claim 1, wherein the grounded shield comprises an inwardly extending ledge that terminates at an end of the grounded shield, and wherein the cover ring comprises a first channel formed in a bottom of the cover ring and configured to interface with the end of the grounded shield.

8. The method of claim 7, wherein the first conductive member is partially disposed in a second channel formed in a bottom surface of the cover ring and disposed radially outward from the first channel, wherein the first conductive member is positioned such that the first conductive member contacts an inner bottom surface of the inwardly extending ledge.

9. The method of claim 7, wherein the first conductive member is partially disposed in a second channel formed in an upper surface of the first channel, wherein the first conductive member is positioned such that the first conductive member contacts an outer edge of the end of the grounded shield.

10. The method of claim 7, wherein the first conductive member is partially disposed in a second channel formed in an inner surface of the first channel, wherein the first conductive member is positioned such that the first conductive member contacts an inner surface or an outer surface of the end of the grounded shield.

11. The method of claim 10, wherein the grounded shield comprises a protrusion extending from the end of the grounded shield and configured to interface with the first conductive member.

12. The method of claim 10, wherein the grounded shield comprises a second conductive member electrically coupled to the grounded shield, the second conductive member configured to interface with the first conductive member.

13. The method of claim 1, further comprising:
  positioning the substrate support in a second position such that the substrate support is in contact with the conductive cover ring and such that a conductive member electrically coupled to the cover ring does not contact the grounded shield, wherein the cover ring is electrically floating; and
  performing a plasma enhanced deposition process.

14. The method of claim 13, wherein performing the plasma enhanced deposition process comprises:
  depositing a layer of material atop the substrate such that an amount of material deposited atop a bottom of a feature formed in the substrate is greater than an amount of material deposited atop a sidewall of the feature formed in the substrate.

15. The method of claim 13, wherein positioning the substrate support in the second position comprises:
  raising the substrate support such that a portion of a deposition ring disposed atop the substrate interfaces with a lip of the cover ring extending radially inward from the cover ring to lift the a portion of the cover ring off of a portion of the grounded shield such that the conductive member does not contact the grounded shield.

16. A computer readable medium having instructions stored thereon that, when executed, cause a method of processing a substrate to be performed in a process chamber, the method comprising:
  placing a substrate atop a substrate support disposed beneath a processing volume of a process chamber having a grounded shield surrounding the process volume and a conductive cover ring selectably supportable by the grounded shield;
  positioning the substrate support in a first position such that the substrate support is not in contact with the conductive cover ring and such that a first conductive member electrically coupled to the cover ring contacts the grounded shield to electrically couple the cover ring to the grounded shield; and
  performing a plasma enhanced etch process on the substrate.

17. The computer readable medium of claim 16, wherein performing the plasma enhanced etch process on the substrate comprises:
  providing a power at a frequency of greater than about 27 MHz from an RF power source to ignite a process gas to form a plasma; and
  etching a layer disposed atop the substrate.

18. The computer readable medium of claim 17, wherein etching the layer disposed atop the substrate comprises:
  redistributing at least a portion of the layer from a bottom of feature formed in the substrate to a sidewall of the feature formed in the substrate.

19. The computer readable medium of claim 16, wherein the method further comprises:
  positioning the substrate support in a second position such that the substrate support is in contact with the conductive cover ring and such that a conductive member electrically coupled to the cover ring does not contact the grounded shield, wherein the cover ring is electrically floating; and
  performing a plasma enhanced deposition process.

20. The computer readable medium of claim 19, wherein performing the plasma enhanced deposition process comprises:
  depositing a layer of material atop the substrate such that an amount of material deposited atop a bottom of a feature formed in the substrate is greater than an amount of material deposited atop a sidewall of the feature formed in the substrate.

* * * * *